(12) United States Patent
Silvus et al.

(10) Patent No.: US 7,502,982 B2
(45) Date of Patent: Mar. 10, 2009

(54) ITERATIVE DETECTOR WITH ECC IN CHANNEL DOMAIN

(75) Inventors: Gregory L. Silvus, Boulder, CO (US); Thomas V. Souvignier, Longmont, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 451 days.

(21) Appl. No.: 11/132,414

(22) Filed: May 18, 2005

(65) Prior Publication Data

US 2006/0265634 A1  Nov. 23, 2006

(51) Int. Cl.
*H03M 13/00* (2006.01)

(52) U.S. Cl. .......... 714/753; 714/755; 714/758; 714/784; 714/786

(58) Field of Classification Search .......... 714/752, 714/786, 753, 755, 758, 784
See application file for complete search history.

(56) References Cited

U.S. PATENT DOCUMENTS

| | | | |
|---|---|---|---|
| 5,659,580 A | 8/1997 | Partyka | 375/295 |
| 5,721,745 A | 2/1998 | Hladik et al. | 371/43 |
| 5,825,832 A | 10/1998 | Benedetto | 375/341 |
| 5,881,308 A | 3/1999 | Dwyer, III | 39/800.23 |
| 5,983,385 A | 11/1999 | Khayrallah et al. | 714/755 |
| 6,005,894 A * | 12/1999 | Kumar | 375/270 |
| 6,023,783 A | 2/2000 | Divsalar et al. | 714/792 |
| 6,035,427 A | 3/2000 | Kweon | 714/702 |
| 6,151,296 A * | 11/2000 | Vijayan et al. | 370/473 |
| 6,178,530 B1 | 1/2001 | Aman et al. | 714/702 |
| 6,192,503 B1 | 2/2001 | Chennakeshu et al. | 714/796 |
| 6,282,168 B1 * | 8/2001 | Vijayan et al. | 370/203 |
| 6,289,486 B1 | 9/2001 | Lee et al. | 714/788 |
| 6,304,985 B1 | 10/2001 | Sindhushayanna et al. | 714/702 |
| 6,353,900 B1 | 3/2002 | Sindhushayanna et al. | 714/701 |
| 6,366,776 B1 * | 4/2002 | Wright et al. | 455/427 |
| 6,445,755 B1 | 9/2002 | Chung et al. | 375/341 |
| 6,581,182 B1 | 6/2003 | Lee | 714/795 |
| 6,668,026 B1 | 12/2003 | Miyauchi | 375/341 |
| 6,675,348 B1 | 1/2004 | Hammons, Jr. et al. | 714/790 |
| 6,708,308 B2 | 3/2004 | De Souza et al. | 714/795 |
| 6,760,390 B1 | 7/2004 | Desai et al. | 375/341 |

(Continued)

FOREIGN PATENT DOCUMENTS

EP  1 463 255 A1  9/2004

(Continued)

OTHER PUBLICATIONS

Claude Berrou, Patrick Adde, Ettiboua Angui and Stephane Faudeil, "A Low Complexity Soft-Output Viterbi Decoder Architecture," Proc. Of ICC 1993, pp. 737-740.

(Continued)

*Primary Examiner*—Esaw T Abraham
(74) *Attorney, Agent, or Firm*—Westman, Champlin & Kelly, P.A.

(57) ABSTRACT

A communications channel is provided, which includes a receive path having an iterative decoder and an ECC decoder. The iterative decoder has a soft channel detector with a soft output. The ECC decoder is coupled to decode bits produced from soft information received from the soft output and operates on the bits in a bit order that is the same as that on the soft output.

14 Claims, 4 Drawing Sheets

U.S. PATENT DOCUMENTS

| | | | |
|---|---|---|---|
| 6,798,852 B2 * | 9/2004 | Khayrallah et al. | 375/341 |
| 6,802,037 B2 | 10/2004 | Kim et al. | 714/755 |
| 6,845,482 B2 | 1/2005 | Yao et al. | 714/755 |
| 7,010,051 B2 | 3/2006 | Murayama et al. | 375/262 |
| 7,050,419 B2 | 5/2006 | Azenkot et al. | 370/347 |
| 7,051,270 B2 | 5/2006 | Miyauchi et al. | 714/794 |
| 7,191,377 B2 | 3/2007 | Berens et al. | 714/755 |
| 2002/0021516 A1 | 2/2002 | Burns et al. | 360/46 |
| 2002/0046371 A1 | 4/2002 | Halter | 714/702 |
| 2002/0154430 A1 | 10/2002 | Rae et al. | 360/25 |
| 2002/0154620 A1 | 10/2002 | Azenkot et al. | 370/347 |
| 2002/0168033 A1 | 11/2002 | Suzuki et al. | 375/341 |
| 2003/0058954 A1 | 3/2003 | He | 375/262 |
| 2003/0076873 A1 | 4/2003 | Wengerter et al. | 375/141 |
| 2003/0097621 A1 | 5/2003 | Xin | 714/701 |
| 2003/0126551 A1 | 7/2003 | Mantha et al. | 714/790 |
| 2003/0193966 A1 | 10/2003 | Mills | 370/476 |
| 2004/0010742 A1 | 1/2004 | Williamson et al. | 714/746 |
| 2004/0255217 A1 | 12/2004 | Garrett et al. | 714/746 |
| 2004/0264561 A1 | 12/2004 | Alexander et al. | 375/232 |
| 2005/0022090 A1 | 1/2005 | Cameron et al. | 714/755 |
| 2005/0034046 A1 | 2/2005 | Berkmann et al. | 714/755 |
| 2006/0107176 A1 | 5/2006 | Song | 714/758 |

FOREIGN PATENT DOCUMENTS

| | | |
|---|---|---|
| EP | 1 463 256 A1 | 9/2004 |
| JP | 2000341140 | 12/2000 |
| JP | 2004215310 | 7/2004 |

OTHER PUBLICATIONS

C. Berrou, A. Glavieux, and P. Thitimajshima, "Near Shannon limit error-correction coding and decoding: Turbo-codes," in Proc IEEE ICC 1993, pp. 1064-1070.

J. Hagenauer, E. Offer, and L. Papke, "Interative decoding of binary block and convolutional codes," IEEE Trans. Info. Theory, vol. 42, pp. 429-445, Mar. 1996.

R. Pyndiah, "Near-optimum decoding of product codes: block turbo codes," IEEE Trans. Commun., vol. 46, No. 8, pp. 1003-1010, Aug. 1998.

J. Hagenauer and P. Hoeher, "A Viterbi algorithm with soft-decision outputs and its applications," in Proc. IEEE Globecom '89, (Dallas, TX, Nov. 1989), pp. 1680-1686.

L.R. Bahl, J. Cocke, F. Jelinek, and J. Raviv, "Optimal decoding of linear codes for minimizing symbol error rate," IEEE Trans. Inform. Theory, vol. IT-20, pp. 284-287, Mar. 1974.

Ramesh Pyndiah, Alain Glavieux, Annie Picart and Sylvie Jacq, "Near Optimum Decoding of Product Codes," IEEE, 1994, pp. 339-343.

Engling, Yoo, Payam Pakzad, Borivoje Nikolic, Venkat Anantharam, "VLSI Architectures for Interactive Decoders in Magnetic Recording Channels," IEEE Transactions on Magnetics, vol. 37, No. 2, Mar. 2001.

U.S. Appl. No. 11/132,414, filed May 18, 2005, entitled "Iterative Detector With ECC in Channel Domain".

U.S. Appl. No. 11/131,518, filed May 18, 2005, entitled "Low Complexity Pseudo-Random Interleaver".

Chen et al., "Dual-Mode Convolutional/SOVA Based Turbo Code Decoder VLSI Design for Wireless Communication Systems," 2003, IEEE, pp. 369-372.

Augsburger et al, "500 Mb/s Soft Output Viterbi Decoder," 2002, ESSCIRC, pp. 523-526.

Lee et al., A Code-Aided Adaptive Equalizer Using Soft Decision-Directed Algorithm and Convolutional Coding for Fading Channels, 2001, IEEE, pp. 1664-1667.

A. Abbasfar et al., "Interleaver Design for High Speed Turbo Decoders," IEEE Communications Society, 2004, pp. 1611-1615.

C. Fragouli et al., "Turbo-Encoder Design for Symbol-Interleaved Parallel Concatenated Trellis-Coded Modulation," IEEE Transactions on Communications, vol. 49, No. 3, Mar. 2001, pp. 425-435.

M. Darmon et al., "A New Pseudo-Random Interleaving For Anti-jamming Application," IEEE, 1989, pp. 6-10.

* cited by examiner

ITERATIVE DETECTOR WITH ECC IN CHANNEL DOMAIN

CROSS-REFERENCE TO RELATED APPLICATIONS

Cross-reference is hereby made to U.S. application Ser. No. 11/131,797, entitled "SECOND STAGE SOVA DETECTOR" and to U.S. application Ser. No. 11/131,518, entitled "LOW COMPLEXITY PSEUDO-RANDOM INTERLEAVER", which were filed on even date herewith.

FIELD OF THE INVENTION

The present invention relates communication channels and more particularly to channels having iterative detectors and error correction codes.

BACKGROUND OF THE INVENTION

In communication channels, data must be transmitted through the channel reliably. Data is represented as a sequence of bits, which each bit taking a value of zero or one. In most communication channels, two major components ensure the reliability of the data: a detection channel (or detector) and an error correction code (ECC). The detector receives an analog waveform from the channel, converts the analog waveform to a digital waveform, and then converts the digital waveform into ones and zeros. The ones and zeros are grouped in contagious subsequence of bits known as symbols. The number of bits in a symbol is determined as a parameter of the ECC and is typically a small number, such as ten. The data symbols are transmitted to an ECC decoder, where erroneous symbols are corrected, assuming that the number of symbols that the ECC has been designed to correct has not been exceeded.

A simple ECC code is based on parity. A parity bit is added to a group of data bits, such as a data word, and has a logic state that is selected to make the total number of ones (or zeros) in the data word either even or odd. The original data word is then transmitted to the channel along with the additional parity bit as a modified data word or "ECC symbol". The ECC symbol is received from the channel and ECC decoder checks the parity of the ECC symbol against an expected value. If the parity is correct, the ECC detection circuit assumes there are no bit errors. If the parity is incorrect, the ECC detection circuit assumes there is an error in the transmitted data.

More complex ECC codes have also been used for enabling not only detection of additional errors but also correction of some of the detected errors. For example, a single-error correction, double-error detection (SEC-DED) Hamming code adds enough additional parity bits to enable the detection circuit to detect and correct any single-bit error in a data word and detect two-bit errors. Other types of error correction codes include convolution (tree) codes and block codes. In these types of ECC codes, one or more data words are divided into blocks of data, and each block of data is encoded into a longer block of data known as an ECC symbol. With convolution codes, the encoding of one block of data depends on the state of the encoder as well as the data to be encoded. For example, Reed Solomon ECC codes correct symbols (groups of bits), not bits.

A new method of detection is now being considered for use in some communication channels, including hard drive and storage applications. That method is called "iterative" (or "turbo") decoding, because the data is processed multiple times in the detector. In a typical iterative decoder, special coding (parity and interleaving are two of several options) is introduced before the data is transmitted to the channel. When the data is received from the channel, the data runs through a "soft decoder", which produces quality "soft" information about each bit decision it makes. The soft decisions are transferred to a block that resolves the parity based on the hard and soft information. This step is often implemented with a technique called "message passing." Once the message passing is complete, both the soft and hard information have been altered and hopefully improved. This updated information is passed back to the soft decoder where the signal is detected again. Finally, the hard and soft detector output is sent back to the parity resolver, where the hard and soft information is once again improved. This iteration process may continue any number of times. Practically, the number of iterations is limited by the time that system has to deliver the data to the user. The result is an increased confidence or reliability of the detected data.

When ECC is used in combination with an iterative type of encoding/decoding system, the ECC symbols are typically generated before the iterative or turbo code is applied. Although ECC codes enable the detection and correction of some errors that are not detected by the iterative or turbo detector, further coding of the data bits before transmission through the channel can limit the effectiveness of the ECC codes. Improved coding and decoding techniques are therefore are desired.

Embodiments of the present invention provide solutions to these and other problems and offer other advantages over the prior art.

SUMMARY OF THE INVENTION

One embodiment of the present invention is directed to a communications channel, which includes a receive path having an iterative decoder and an error correction code (ECC) decoder. The iterative decoder has a soft channel detector with a soft output. The ECC decoder is coupled to decode bits produced from soft information received from the soft output and operates on the bits in a bit order that is the same as that on the soft output.

Another embodiment of the present invention is directed to a communications channel having a transmit path. The transmit path includes an error correction code (ECC) encoder, which receives user data and generates corresponding ECC symbols. A de-interleaver reorders bits in the ECC symbols to produce de-interleaved ECC symbols. An outer encoder encodes the de-interleaved ECC symbols to produce corresponding codewords. An interleaver reorders bits in the codewords to produce interleaved codewords for transmission through a channel medium.

Another embodiment of the present invention is directed to a method of decoding a signal received from a channel. The method includes: receiving the signal with an iterative decoder comprising a soft channel detector and an outer decoder; producing soft information at an output of the soft channel detector regarding logic states of detected bits in the signal; and converting the soft information into ECC symbols and decoding the ECC symbols in a bit order that is the same as that on the output of the soft channel detector.

Other features and benefits that characterize embodiments of the present invention will be apparent upon reading the following detailed description and review of the associated drawings.

DETAILED DESCRIPTION OF ILLUSTRATIVE EMBODIMENTS

In a typical communication channel having an iterative-type of decoding system, two domains exist: a code or parity domain, in which error correction codes (ECC) are added to the user data bits, and a channel or detector domain in which the bits of the user data words and the ECC codes are interleaved (re-ordered) with one another. It is standard practice to apply ECC codes in the code or parity domain. In an embodiment of the present invention, the ECC codes are applied in the channel domain to improve post-ECC performance and reduce hardware complexity.

Figure 1:
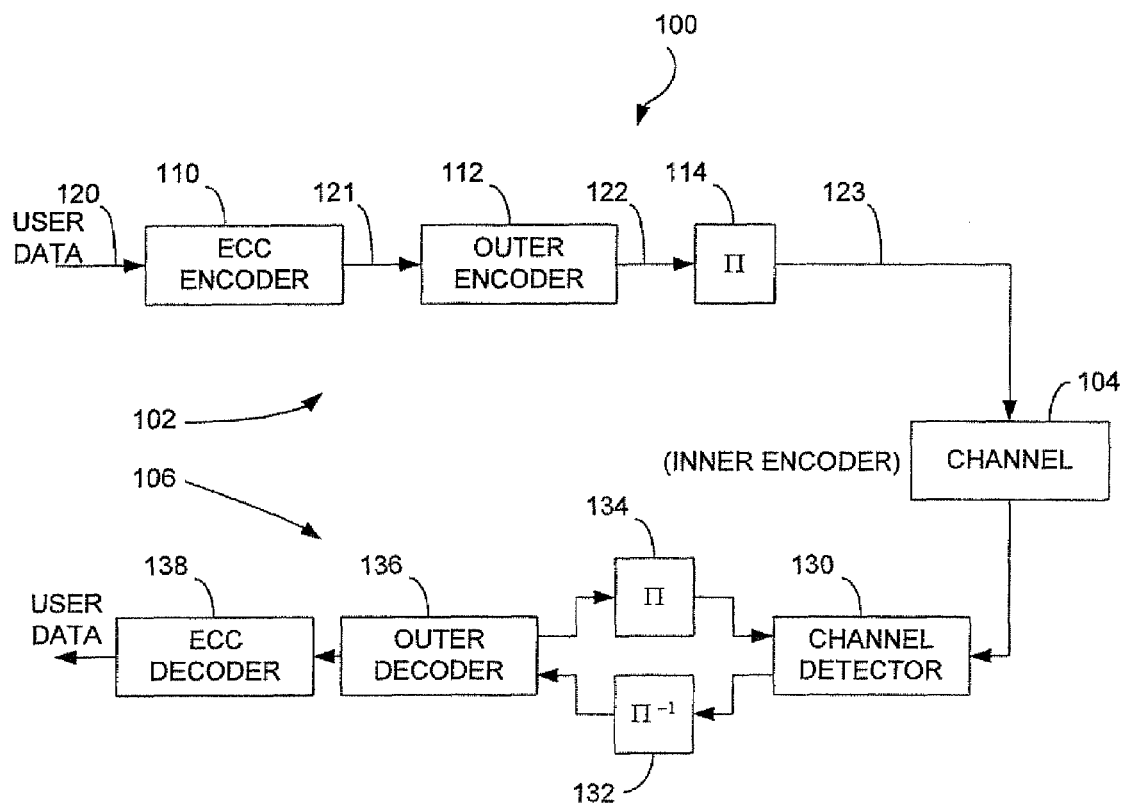
FIG. 1 is a block diagram illustrating an iterative decoding system according to the prior art.

FIG. 1 is a block diagram illustrating a standard iterative encoding/decoding system 100 for a magnetic recording channel according to the prior art. System 100 includes a write (or transmitter) path 102, a channel (magnetic recording media) 104, and a read (or receiver) path 106. Write path 102 includes an ECC encoder 110, an outer encoder 112, and an interleaver 114. ECC encoder 102 receives successive user data words 120 and generates corresponding, multiple-bit symbols 121 at the output of the encoder. Each symbol includes the original data word plus one or more ECC parity bits. ECC symbols 121 are passed to outer encoder 104, which further encodes the ECC symbols into code words 122 having additional outer code parity bits, for example. The additional outer code can include an iterative or "turbo-product" code, for example. The code words 122 are concatenated and passed to interleaver 106, which pseudo-randomly shuffles the order of bits in the code word stream 123 in order to make reliability information gathered in the read channel more evenly distributed and independent of the bit order. The interleaved bit stream 123 is then transmitted to channel 104.

In this example, channel 104 is a magnetic recording channel and acts as an inner encoder. The transmission (or write) part of channel 104 can include typical elements, such as a precoder, a modulator, etc. (these are at the encoding side, i.e., after interleaver 114), which prepare the bit stream for transmission through the channel (and storage in the channel in the case of a recording channel). The front end stages at the detection part of channel 104 can include a preamplifier, a timing circuit, an equalizer and others.

The output of channel 104 is coupled to read path 106, which includes a soft output channel detector 130, a de-interleaver 132, an interleaver 134, an outer decoder 136 and an ECC decoder 138. Essentially, the read path 106 has similar blocks as the write path 102 for undoing the effects of encoding in the write path. In this example of the prior art, channel detector 130 is a Soft Output Viterbi Algorithm (SOVA) detector, which removes inter-symbol interference (ISI) of the channel and therefore acts as an inner decoder. The received signal is first processed by front end circuits (not illustrated in FIG. 1), sampled, equalized and coupled to the input of SOVA detector 130. SOVA detector 130 produces soft (quality) information as to the likely state of each bit position in the received bit stream and provides the soft information to outer decoder 136 through de-interleaver 132. De-interleaver 132 reorders the soft information from the channel domain to a bit order corresponding to the parity domain (the order needed by outer decoder 136 and ECC decoder 138). De-interleaver 132 essentially applies the inverse of the shuffling operation performed by interleaver 114 such that the bits are in the same order as that produced at the output of encoder 112.

Figure 2:
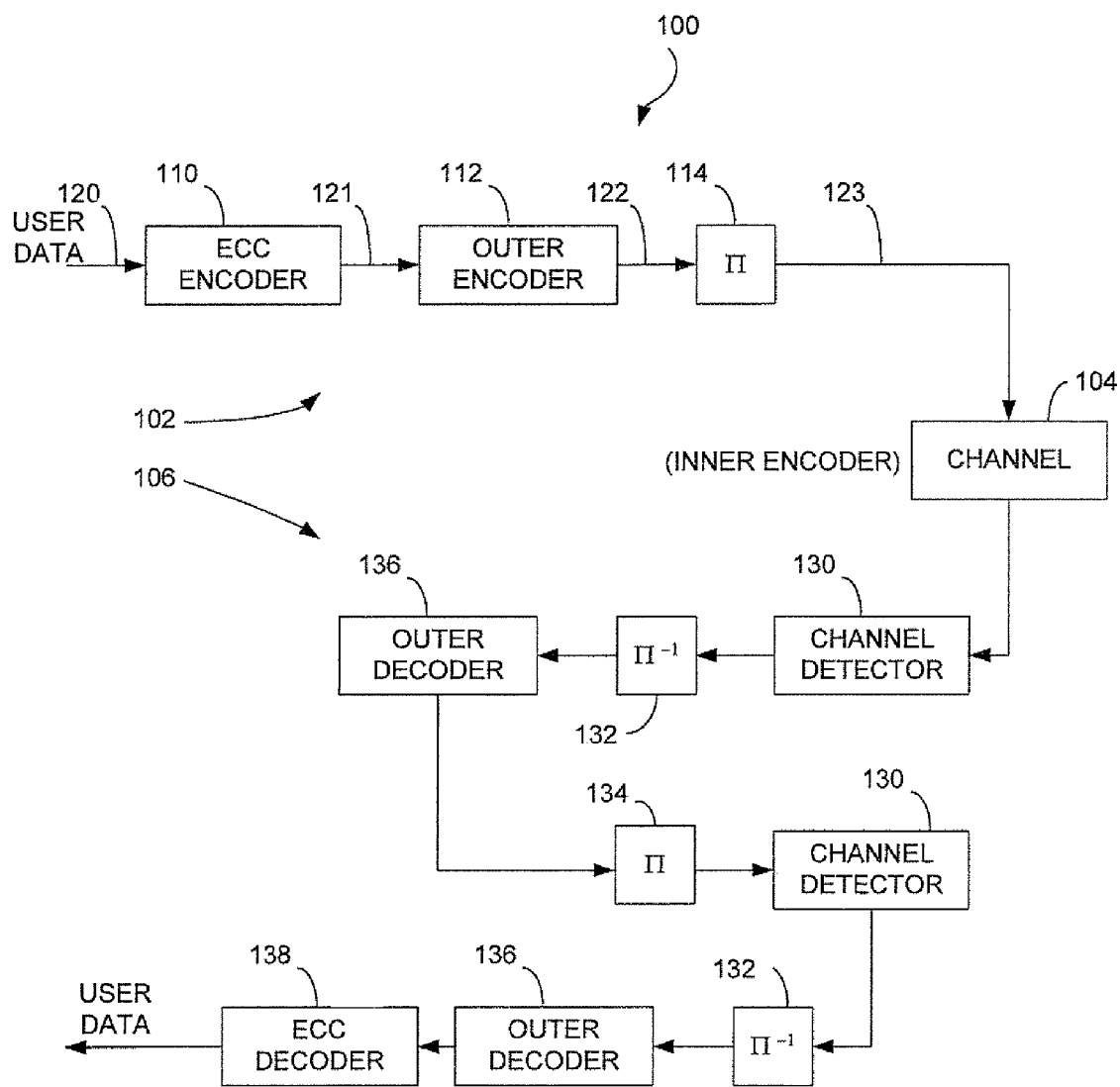
FIG. 2 is a block diagram illustrating an example, two-channel iteration architectural pipeline view of the iterative decoding system shown in FIG. 1.

Outer decoder 136 decodes the outer code parity bits according to the soft information received from SOVA detector 130 and employs a message passing algorithm to produce its own soft information as to the reliability of each bit decision. Depending on whether the outer code parity bits match or do not match the data represented by the soft information produced by SOVA detector 130, outer decoder 136 can upgrade or degrade the reliability of the soft information for the corresponding bit positions. This soft information is compatible with that produced by SOVA detector 130. The soft information produced by outer decoder 136 is passed back to SOVA detector 130 through interleaver 134. Interleaver 134 re-interleaves the soft information into the bit order of the channel domain, where SOVA detector 130 detects the signal again. The SOVA detector 130 again makes decisions as to the likely state of each bit position and takes into account the extrinsic soft information provided by outer decoder 136 to produce new soft information as to each bit position, which is hopefully improved as compared to the first iteration. The new soft information is passed back to outer decoder 136, where the soft information is once again improved. This iteration process may continue any number of times. Practically, the number of iterations is limited by the time the system has to deliver the data to the user. FIG. 2 is a block diagram of a pipeline view showing two iterations through the read channel shown in FIG. 1.

Once the iteration process has completed, a final "hard" decision is made based on the soft information whether each bit position is more likely a one or a zero. The final soft information is then converted to ones and zeros. The outer parity bits used by outer decoder 136 are discarded by decoder 136, and the remaining user data bits are passed through ECC decoder 138. ECC decoder 138 resolves the ECC parity bits to detect and/or correct any errors not corrected by the iterative detector formed by SOVA detector 130 and outer decoder 136. ECC decoder 138 then outputs respective user data words, which should correspond to the original user data words received by ECC encoder 110 at the input of the write path.

Figure 3:
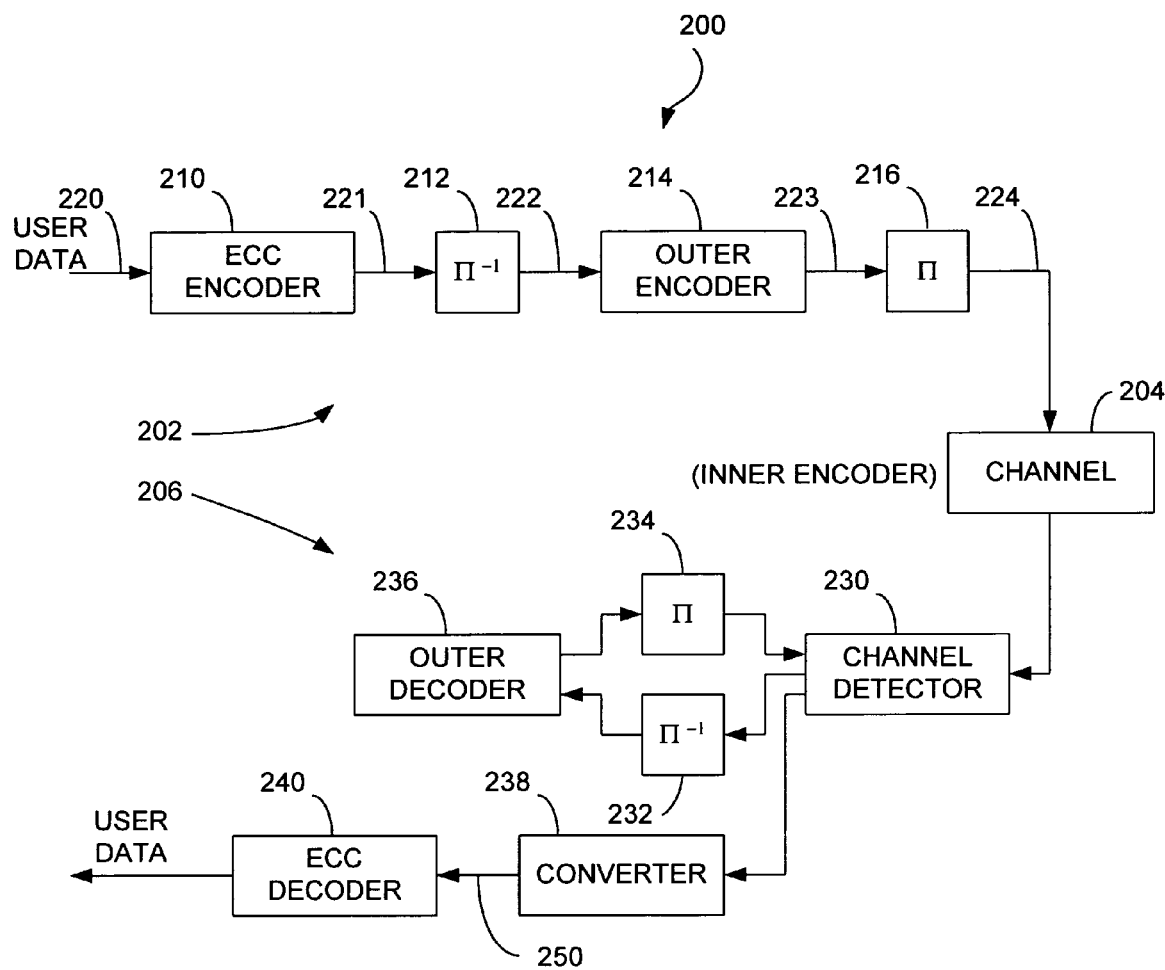
FIG. 3 is a block diagram illustrating a pipeline view of an iterative decoding system according to one embodiment of the present invention.
Figure 4:
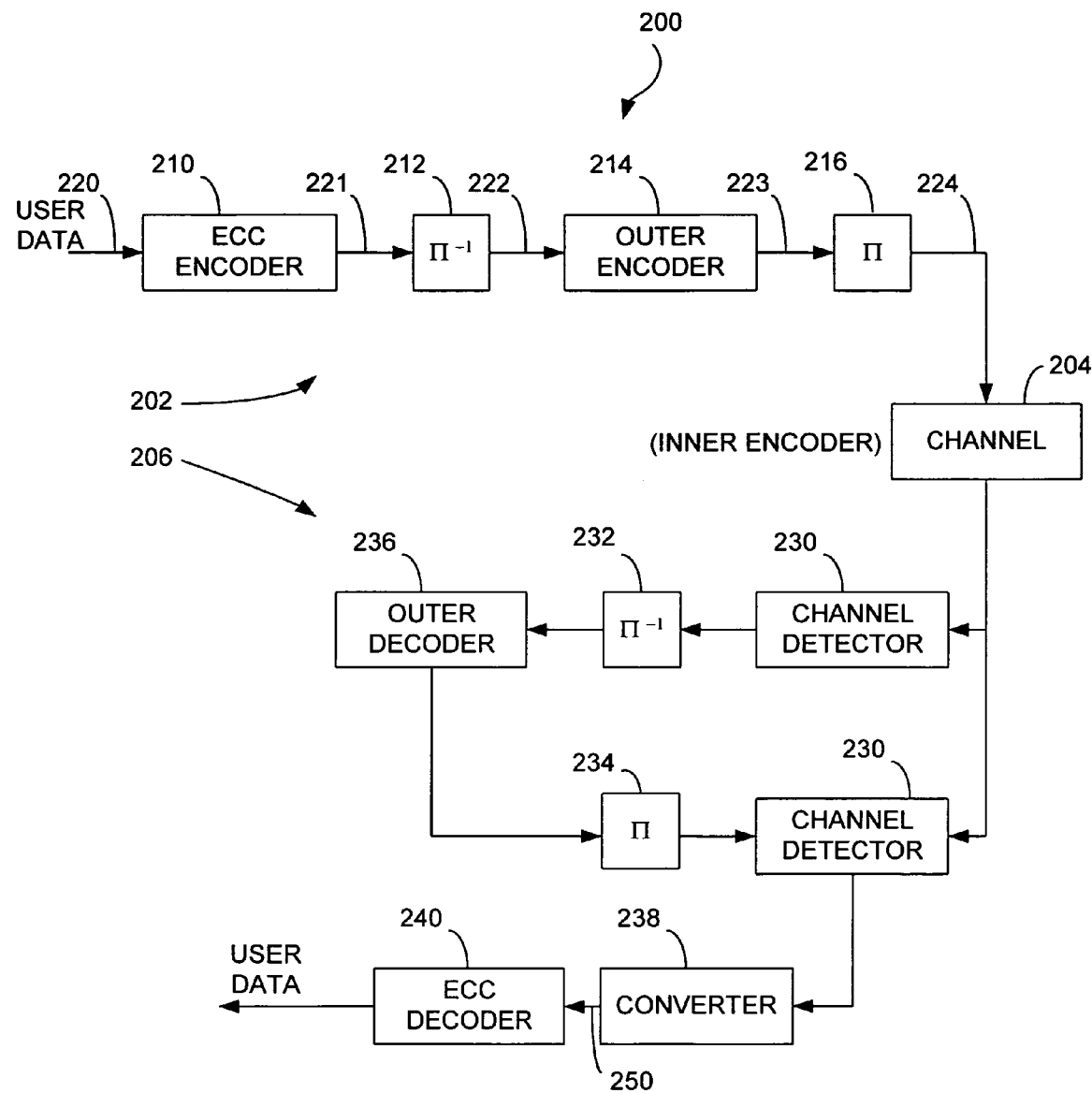
FIG. 4 is a block diagram illustrating a pipeline view of the iterative decoding system shown in FIG. 3.

FIG. 3 is a block diagram illustrating an iterative encoding/decoding system 200 according to one embodiment of the present invention. FIG. 4 is a block diagram illustrating a pipeline view of two iterations through the system shown in FIG. 3. System 200 can correspond to any communication channel through which data is transmitted or received, such as satellite, cellular and storage channels.

System 200 includes a transmit path 202, a channel 204 and a receive path 206. In the case of a data storage channel, transmit path 202 corresponds to a write path, receive path 206 corresponds to a read path, and channel 204 corresponds to a storage device, such as a hard disc or other memory device. Transmit path 202 includes an ECC encoder 210, de-interleaver 212, outer encoder 214 and interleaver 216. ECC encoder 210 receives a sequence of user data words 220 and produces corresponding multiple-bit ECC symbols 221. ECC encoder 210 can operate on any number of user data bits, such as individual user data words or an entire data sector. In one embodiment, ECC encoder 210 operates on a data sector.

A simple ECC code is based on parity. A parity bit is added to a group of data bits, such as a data word, and has a logic state that is selected to make the total number of ones (or zeros) in the data word either even or odd. The original data word is then passed to de-interleaver 212 along with the additional parity bit as a modified data word or "ECC symbol" 221. In receive path 206, the parity of the ECC symbol can be checked against an expected value. If the parity is correct, the receive path assumes there are no bit errors. If the parity is incorrect, the receive path assumes there is an error in the transmitted data.

More complex ECC codes can also been used for enabling not only detection of additional errors but also correction of some of the detected errors. For example, a single-error correction, double-error detection (SEC-DED) Hamming code adds enough additional parity bits to enable the detection circuit to detect and correct any single-bit error in a data word and detect two-bit errors. Other types of error correction codes include convolution (tree) codes and block codes. In these types of ECC codes, one or more data words are divided into blocks of data, and each block of data is encoded into a longer block of data known as an ECC symbol, as mentioned above. With convolution codes, the encoding of one block of data depends on the state of the encoder as well as the data to be encoded. A Reed Solomon ECC codes correct symbols (groups of bits), not bits. In one embodiment, ECC encoder 210 implements a Reed Solomon Code, and each ECC symbol 221 includes one or more data bits and one or more ECC parity bits. The ECC parity bits can be concatenated to the data bits, distributed among the data bits or encoded with the data bits.

De-interleaver 212 changes the order of the bits in the ECC symbol so that they are in the order in which the bits will be transmitted through channel 204. Any suitable type of interleaver (permuter) can be used in accordance with an embodiment of the present invention. For example, de-interleaver 212 can pseudo-randomly shuffle the bit order.

The de-interleaved ECC symbols 222 are passed to outer encoder 214, which further encodes the data before the data is transmitted to channel 204. Outer encoder 214 can implement any suitable type of code, such as a block code, a convolution code, a Low Density Parity Check (LDPC) code, single parity check (SPC), turbo code, or a Turbo-Product Code (TPC) to add outer parity bits, for example, to the de-interleaved symbols 222. In one embodiment, outer encoder 214 implements a TPC code, which generates a multi-dimensional array of code words using linear block codes, such as parity check codes, Hamming codes, BCH codes, etc. The simplest type of TPC code is a two-dimensional TPC single parity check (TPC/SPC) with a single parity bit per row and column. A TPC with a multiple parity check (TPC/MPC) is similar to a TPC/SPC code with the exception that there are multiple row parity bits and multiple column parity bits. The multiple parity bits provide more flexibility in code structure, code rate and code length.

In general, two-dimensional multi-parity turbo product codes are constructed from two linear binary block codes $C_1$ and $C_2$ with parameters $(n_1, k_1, d_1)$ and $(n_2, k_2, d_2)$, where $(n_i, k_i, d_i, i=1, 2, \ldots)$ are the code word length, user data block length and minimum distance, respectively. A two-dimensional turbo product code $C=C_1 \times C_2$ has parameters $(n, k, d)$, where $n=n_1 \cdot n_2$, $k=k_1 \cdot k_2$, and $d \geq d_1 d_2$. Its generator matrix is the Kronecker product (also termed the direct matrix product) of the generator matrices of its component codes. For example, the Kronecker product of a 2×2 matrix A and a 3×2 matrix B is given by the following 6×4 matrix, $$A \otimes B = \begin{bmatrix} a_{11}B & a_{12}B \\ a_{21}B & a_{22}B \end{bmatrix} = \begin{bmatrix} a_{11}b_{11} & a_{11}b_{12} & a_{12}b_{11} & a_{12}b_{12} \\ a_{11}b_{21} & a_{11}b_{22} & a_{12}b_{21} & a_{12}b_{22} \\ a_{11}b_{31} & a_{11}b_{32} & a_{12}b_{31} & a_{12}b_{32} \\ a_{21}b_{11} & a_{12}b_{12} & a_{22}b_{11} & a_{22}b_{12} \\ a_{21}b_{21} & a_{21}b_{22} & a_{22}b_{21} & a_{221}b_{22} \\ a_{21}b_{31} & a_{21}b_{32} & a_{22}b_{31} & a_{22}b_{32} \end{bmatrix}$$

In the case of TPC/SPC, each row and each column satisfies a single-parity check, and the minimum distance for an m-dimensional TPC/SPC is 2 m. For applications in data storage systems, two-dimensional TPC/SPC and TPC/MPC codes are preferred for the sake of higher rates. Further, both row and column codes of a TPC code should be chosen the same to save hardware cost in a real implementation.

The code words 223 produced by outer encoder 214 are passed through interleaver 216, which shuffles the bits in code words 223 in a pseudo-random fashion to produce interleaved code words 224 for transmission through channel 204. Interleaver 226 essentially performs the reverse of the shuffling process performed by de-interleaver 212 to place the bits back into the order of the channel domain.

The input end of channel 204 can include elements such as a precoder, a modulator, etc. The output end of channel 204 can include elements such as a preamplifier, a timing circuit, an equalizer and others. In the case of a magnetic recording channel, the read/write process and equalization act as an inner encoder. However, channel 204 can include any other media, such as a twisted pair, optical fiber, satellite, cellular or any other wired or wireless digital or analog communication system.

Receiver path 206 includes a channel detector 230, a de-interleaver 232, an outer decoder 236, an interleaver 234, a data converter 238 and an ECC decoder 240. At the input side of channel detector 230, the analog waveform received from channel 204 is equalized and sampled to form a digital waveform. Channel detector 230 and outer decoder 236 then convert the digital waveform into ones and zeros. The ones and zeros are grouped into contiguous subsequences of bits known as symbols. The number of bits in a symbol is determined as a parameter of the ECC encoder 210 used in transmit path 202. The number of bits in a symbol is typically a small number such as ten. The ECC symbols are then transmitted to the ECC decoder 240, which detects and/or corrects any erroneous symbol that has not been corrected by channel detector 230 and outer decoder 236, assuming that the number of erroneous symbols does not exceed the number of symbols that the ECC code has been designed to correct.

Channel detector 230 can include any type of "soft decoder", which produces quality "soft" information about each bit decision it makes. For example, channel detector 230 can include a Soft-Output Viterbi Algorithm (SOVA) detector or a Bahl, Cocke, Jelinek and Ravive (BCJR) algorithm detector. In this embodiment, channel detector 230 is described as being a SOVA detector with an outer decoder 236. However, it is to be understood that these are implemented-specific and can be replaced by other blocks that accomplish the same goals of detecting the data and producing soft (quality) information and of processing of the data to resolve the parity of the outer code.

For each bit position "u" in the received digital waveform, channel detector 230 makes a soft decision, which can be expressed in terms of a log-likelihood ratio (LLR), for example, which can be defined as the probability ratio $\lambda=\Pr\{u=1\}/\Pr\{u=0\}$. The LLR represents the probability or confidence that the bit position is either a logic one or a zero. In some applications, it is more convenient to use $\log \lambda$ as a soft decision. The LLR ratio for each bit position can be expressed in terms of a signed number relative to a threshold, such as zero. For example, the signed numbers can range from +10 to −10. The sign of the number represents the likely state of the bit, with a "+" representing a logic one and a "−" representing a logic zero. The magnitude of the number represents the degree of confidence channel detector 230 has in the particular state. For example, a +1 can indicate that the bit might be a logic 1, but it's not sure. A +5 can indicate that the bit is probably a logic one and a +10 can represent that the bit is almost certainly logic one. Whereas, a −4 may reflect that the bit is probably a logic zero.

In this example, the soft, extrinsic reliability information (e.g., LLR) passed from channel detector 230 to outer decoder 236 take the form of a sequence numbers or probabilities, as discussed above, with each probability representing one bit of the code word. An example of a sequence of soft information might be: +5, −1, +6, +4 . . . .

The bit positions in the sequence at the output of channel detector 230 are in the order that the bit positions were transmitted through channel 204. De-interleaver 232 re-arranges the bit positions to place the bits (soft information) in the order in which they were originally encoded by outer encoder 214. Based on the soft information provided by channel detector 230, outer decoder 236 resolves the corresponding outer parity bits for each code word or set of code words. Outer decoder 236 decodes the outer code implemented by outer encoder 214 and, based on the results of the parity checks generates altered (hopefully improved) soft information as to the confidence or reliability of each bit decision. The soft decisions produced by outer decoder 236 are generated with a technique called "message passing." For example, outer decoder 236 can upgrade or degrade the soft information depending on whether the outer parity bits match or do not match the corresponding data in the code word. The soft information can be degraded by reducing the magnitude of the signed number, such as from +5 to +2. The soft information can be upgraded by increasing the magnitude of the signed number, such as from +2 to +5.

Once the message passing algorithm is complete, the updated soft information is passed back to channel detector 230 through interleaver 234. Interleaver 234 reorders the soft information back into the bit order of the channel domain. Channel detector 230 uses the updated soft information provided by outer decoder 236 as extrinsic information and again detects the signal received from channel 204 to produce further updated soft bit decisions. These soft bit decisions are again passed to outer decoder 236 through de-interleaver 232. This iteration process may continue any number of times.

When the iteration process is complete, channel detector 230 makes hard decisions as to the logic states of each bit position based on overall reliability information (e.g., LLR). For example, the soft bit decisions made by channel detector 230 and outer decoder 236 may converge toward values of +10 and −10. When the iterations are complete, data converter 238 compares each signed number in the soft information to the threshold e.g., ("zero") in order to convert each soft decision into a logic "one" or "zero". Converter 238 also discards the bits corresponding to the outer parity used by outer decoder 236. For sequence of soft (now hard) information, converter 238 produces a corresponding ECC symbol 250 representing the most likely bit values as determined by channel detector 230 and outer decoder 236.

ECC encoder 240 receives the ECC symbols generated by converter 238 and decodes the ECC symbols into corresponding user data words 251. The ECC code implemented by ECC encoder 210 allows ECC decoder 240 to detect and/or correct erroneous symbols, assuming the number of symbols that the ECC has been designed to correct has not been exceeded.

FIG. 4 is a block diagram illustrating a pipeline view of system 200 for two iterations through channel detector 230 and outer decoder 236. As shown in FIGS. 3 and 4, ECC decoder 240 is coupled to the output of channel detector 230 rather than the output of outer decoder 236. This is possible since ECC encoder 210 in transmit path 202 applies the ECC code to the bits when they are in the channel order. De-interleaver 212 changes the order of the bits to put them back into the "user domain". Outer encoder 214 operates in the user domain, and interleaver 216 puts the bits back into the channel domain. Thus, ECC decoder 240 can operate in the "channel domain", directly at the output of channel detector 230.

Since ECC decoder 240 takes data from the output of the soft channel detector 230, an $n^{th}$ copy of outer decoder block 236 (similar to the second occurrence of outer decoder 136 in FIG. 2) is not required. Further, an $n^{th}$ copy of the de-interleaver (similar to the second occurrence of de-interleaver 132 in FIG. 2) is not required. Although a new interleaver 212 is introduced on transmit side 202, the interleaver that is removed on receive side 206 is several bits wide. For example, soft information can be 4-5 bits wide. The interleaver 212 added on transmit side 202 is only one bit wide, for example. Therefore, even if the performance between the system shown in FIGS. 1 and 2 is the same as the performance of the system shown in FIGS. 3 and 4, the system shown in FIGS. 3 and 4 provides the benefit of greatly reduced complexity.

However it has also been found that the performance of the system shown in FIGS. 3 and 4 can be greater than that of the system shown in FIGS. 1 and 2. The raw bit error rate at the output of the channel detector is almost always worse than at the output of the outer decoder. But what the inventors of the present application have discovered was that the errors that occur at the output of the channel detector are clumped together and the errors that occur at the message passing output of the outer decoder are spread out. The reason the bits after the message passing are more spread out is that the de-interleaver between the soft detector and the outer decoder disperses the clumped output errors from the soft detector. The Reed-Solomon ECC that is used by the ECC encoder corrects symbols (groups of bits) not bits. So if one bit in every error symbol is an error, the channel has not sufficiently utilized the ECC since an entire ECC symbol is wasted by correcting a single bit. Because errors at the output of the SOVA detector are clumped, more of the bit errors that occur after the SOVA detector fall within a single Reed-Solomon code symbol.

The ultimate gain in error correction performance has been more noticeable with some techniques than others. The sector failure rate (post-ECC error rate) was measured for turbo product codes. With turbo products codes, there was a dramatic improvement in sector failure rate when implementing the architecture shown in FIGS. 3 and 4. The sector failure rate was also measured for single parity codes (SPCs) where the improvement was variable, but mostly better. In most cases, an improvement can be seen when ECC is applied at the output of a soft channel detector as compared to the output of the outer decoder. It also appears that the errors at the output of the soft detector are better behaved than at the output of the outer decoder. In addition, it has been found that the post-ECC gains in error reduction from this technique are greater when a stronger iterative code is utilized. In other words, a weak SPC code with a SOVA detector and no "precoding" shows less post ECC performance gain than a particular SPC that was made stronger with precoding. Further, both of these weak SPC techniques show less post-ECC performance gain with the structure shown in FIGS. 3 and 4 than a TPC scheme. But, where error performance is similar, the hardware saving is still substantial.

A further complexity change with the embodiment shown in FIGS. 3 and 4 is that the new de-interleaver 212 in write path 202 is reflected in the data size before and after the ECC. Before the ECC, the size is N bits. After the ECC, the data size is N+2tSI bits, where 2tSI is the number of ECC bits, t is the number of ECC symbol corrections, s is the ECC symbol size in bits, and I is the number of interleaves. The different input-to-output size of the interleaver adds some complexity but it is not significant.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the encoding/decoding system while maintaining substantially the same functionality without departing from the scope and spirit of the present invention. In addition, although the embodiment described herein is directed to a SOVA detector, it will be appreciated by those skilled in the art that the teachings of the present invention can be applied to other "soft" output detectors without departing from the scope and spirit of the present invention. Also, the terms "de-interleaver" and "interleaver" as used in the specification and claims are interchangeable.

What is claimed is:

1. A communications channel having a transmit path comprising:
    an error correction encoder, which receives user data and generates corresponding error correction code (ECC) symbols;
    a first de-interleaver, which reorders bits in the ECC symbols to produce de-interleaved ECC symbols;
    an outer encoder, which encodes the de-interleaved ECC symbols to produce corresponding codewords; and
    a first interleaver, which reorders bits in the codewords to produce interleaved codewords for transmission through a channel medium.

2. The communications channel of claim 1 wherein the error correction encoder comprises a Reed-Solomon error correction code, which appends at least one ECC parity bit to each dataword in the user data to form each ECC symbol.

3. The communications channel of claim 1 wherein the first de-interleaver and the first interleaver reorder bits according to a pseudo-random algorithm.

4. The communications channel of claim 1 and further comprising a receive path that comprises an iterative decoder, wherein the iterative decoder comprises:
    a soft channel detector having an input coupled to receive an output signal from the channel medium, a soft information output which produces soft information regarding logic states of detected bits in the output signal, and an extrinsic information input for receiving extrinsic soft information;
    an outer decoder having a soft information input and a soft information output;
    a second de-interleaver coupled between the soft information output of the soft channel detector and the soft information input of the outer decoder; and
    a second interleaver coupled between the soft information output of the outer decoder and the extrinsic information input of the soft channel detector.

5. The communications channel of claim 4 wherein the receive path further comprises:
    a converter coupled to the soft information output of the soft channel detector, which converts the soft information into corresponding ECC symbols; and
    an error correction decoder coupled to receive the ECC symbols from the converter in the same bit order as the soft information at the output of the soft channel detector and to decode the symbols into corresponding user data words.

6. A communications channel having a receive path, which comprises:
    an iterative decoder comprising a soft channel detector comprising a soft output; and
    an error correction code (ECC) decoder, which is coupled to decode bits produced from soft information received from the soft output and operates on the bits in a bit order that is the same as that on the soft output.

7. The communications channel of claim 6, wherein the iterative decoder further comprises:
    a first de-interleaver;
    a first interleaver; and
    an outer decoder, which comprises a soft information input coupled to the soft output of the soft channel detector through the first de-interleaver, and a soft information output, which is coupled to an extrinsic information input of the soft channel detector through the first interleaver.

8. The communications channel of claim 6, wherein the soft information output represents reliability of logic states detected by the soft channel detector for bits received from a channel medium and the soft information output of the outer decoder represents updated reliability of the logic states based on a parity check performed by the outer decoder on the soft information.

9. The communications channel of claim 6 wherein the receive path further comprises:
    a converter coupled between the soft output of the soft channel detector and the ECC decoder, which converts the soft information into corresponding ECC symbols and discards outer code parity bits used by the outer decoder.

10. The communications channel of claim 6 and further including a transmit path comprising:
    an error correction code (ECC) encoder, which receives user data and generates corresponding ECC symbols;
    a second de-interleaver, which reorders bits in the ECC symbols to produce de-interleaved ECC symbols;
    an outer encoder, which encodes the de-interleaved ECC symbols to produce corresponding codewords; and
    a first interleaver, which reorders bits in the codewords to produce interleaved codewords for transmission through a channel medium.

11. The communications channel of claim 10 wherein the error correction code (ECC) encoder comprises a Reed-Solomon error correction code, which appends at least one ECC parity bit to each dataword in the user data to form each ECC symbol.

12. The communications channel of claim 10 wherein the first de-interleaver and the first interleaver reorder bits according to a pseudo-random algorithm.

13. A method of decoding a signal received from a channel, the method comprising:

receiving the signal with an iterative decoder, wherein the iterative decoder comprises a soft channel detector and an outer decoder;

producing soft information at an output of the soft channel detector regarding logic states of detected bits in the signal; and converting the soft information into ECC symbols and decoding the ECC symbols in a bit order that is the same as that on the output of the soft channel detector.

14. The method of claim 13 and further comprising:

de-interleaving the soft information at the output of the soft channel detector before decoding the soft information with the outer decoder;

producing updated soft information with the outer decoder; and interleaving the updated soft information and applying to interleaved updated soft information to the soft channel detector as extrinsic information.

* * * * *